TRANSISTOR WAVEFORM GENERATOR

Filed Dec. 29, 1958

INVENTOR
H. F. PRIEBE, JR.
BY Kenneth B. Hamlin
ATTORNEY

United States Patent Office 2,983,878 Patented May 9, 1961

2,983,878

TRANSISTOR WAVEFORM GENERATOR

Henry F. Priebe, Jr., Morristown, N.J., assignor to Bell Telephone Laboratories, Incorporated, New York, N.Y., a corporation of New York Filed Dec. 29, 1958, Ser. No. 783,583

9 Claims. (Cl. 331—58)

This invention relates to the generation of electrical waveforms and more specifically to waveform generation circuits employing transistors.

Often the design and operation of pulse and digital circuitry necessitate the use of diversified waveform generation circuits. In many instances, these waveform generation circuits have rather limited uses and it is, therefore, advantageous that they be simple and inexpensive. Accordingly, it is a general object of this invention to provide an economical and simple waveform generator.

In particular, many applications have developed requiring double-rate waveforms, such as groups of equally spaced pulses of a frequency $f_1$ recurring at a lower frequency $f_2=cf_1$ where $c$ is less than one. It is usually desirable that these generated pulses be rectangular in form to a close approximation.

Hence, a more particular object of the invention is to provide an economical and simple waveform generator for producing double-rate waveforms.

In its principal aspect, the invention is a transistor blocking oscillator with additional time constant circuitry added to the transistor output. The transistor output is regeneratively coupled back to the input through an inverting transformer. Direct voltage is connected to the transistor to bias it in the forward direction causing the oscillator to be free-running. The additional time constant circuitry in the transistor output provides a signal of a frequency higher than the oscillation frequency of the oscillator. Thus, the waveform generated at the collector output becomes a group of pulses of a particular frequency recurring at approximately the oscillation frequency of the oscillator.

In accordance with a feature of this invention, a waveform generation circuit includes a transistor, a transformer for regeneratively coupling one of the transistor input electrodes and the output electrode, a first resistance-capacitance network connected between the two transistor input electrodes for determining the time the transistor is not conducting, and a second resistance-capacitance network connected between one of the input electrodes and the output electrode for determining the number of pulses generated during the period of time the transistor is conducting.

These and other objects and features of this invention will be better understood upon consideration of the following detailed description and the accompanying drawing, in which.

Figure 1:
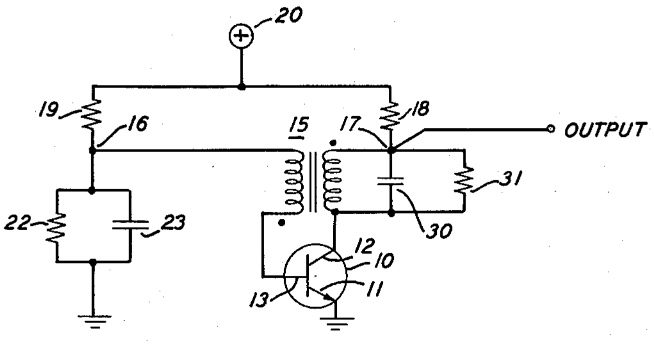
Fig. 1 is an illustrative circuit in accordance with the principles of the invention.

A basic circuit embodying the principles of the invention is shown in Fig. 1 wherein a waveform generator comprises a transistor 10, a transformer 15, capacitors 23 and 30, and resistors 18, 19, 22 and 31. The emitter 11 of transistor 10 is connected to ground potential. The collector 12 is regeneratively coupled to the base 13 through transformer 15. One end of the primary winding of transformer 15 is connected through connection point 17 and resistor 18 to source of supply voltage 20, and the other end of the primary winding is connected to collector 12. The secondary winding of transformer 15 is connected at one end to base 13 and at the other end through connection point 16 and resistor 19 to source 20. Resistor 22 and capacitor 23 are connected in parallel between connection point 16 and ground potential.

Considering the circuit thus far described, the operation is basically that of a blocking oscillator. For purposes of discussion, the use of an NPN junction transistor 10 is assumed, as shown in Fig. 1, and transistor 10 is biased in the forward direction since base 13 is positive with respect to emitter 11. Base bias is derived from voltage division across resistors 19 and 22 through current flow from source 20. Capacitor 23 is charged positively to the potential across resistor 22. Since transistor 10 is biased "on" by this positive potential, current flows from source 20 through the primary winding of transformer 15 and through transistor 10 to ground potential. The current flow in the primary winding of transformer 15 is reflected in the secondary winding such that base 13 becomes more positive, thus assisting in current build-up to saturation in transistor 10. When transistor 10 is "on," the collector voltage is nearly at ground, and the base voltage is equal to the sum of the potential across capacitor 23 and of the potential across the secondary winding of transformer 15.

When transistor 10 reaches saturation, the current in the transformer primary winding is still increasing. The current continues to increase until the collector current and the base current times the current gain of the transistor become equal bringing transistor 10 out of saturation. As transistor 10 turns "off" the collector voltage rises positively toward the potential of source 20. The primary winding of transformer 15 reflects this change into the secondary winding in such a direction as to drive base 13 in the negative direction, assisting transistor 10 in turning "off." It is noted that the base current flow charged capacitor 23 in the negative direction. Therefore, the circuit remains "off" while capacitor 23 charges exponentially in the positive direction from current flow through resistors 19 and 22 from source 20 until the potential at point 16 reaches a value biasing base 13 in the forward direction. Transistor 10 then turns "on" and the cycle repeats. Each successive repetition of the cycle results in a single pulse available at connection point 17 recurring at a particular frequency.

In the present invention, as shown in the circuit of Fig. 1, a resistor 31 and capacitor 30 have been added in parallel between connection point 17 and collector 12 of transistor 10. Along with the inductance of transformer 15, capacitor 30 and resistor 31 form a parallel resonant circuit. The resonant frequency of the parallel circuit is advantageously greater than the recurrence frequency of the blocking oscillator described above. Therefore, in a manner hereinafter described, a group of pulses is generated at connection point 17 rather than a single pulse. In general, the width of each individual pulse is determined by the inductance of transformer 15 and the resistance in the collector circuit, and to a small extent by the characteristics of transistor 10. The period of time between each of the individual pulses in principally determined by capacitor 30 and the transformer inductance. This leaves the number of pulses produced in each group largely under the control of the damping coefficient of the parallel resonant circuit.

Specifically, when transistor 10 is turned "on" by the positive bias at point 16, a "ringing" signal is produced by the transformer inductance and capacitor 30. This signal swings, in general, about the potential level at connection point 16. On the positive swing of the ringing signal, the active region of transistor 10 is entered and transistor 10 is turned "on." After reaching its peak, the positive swing starts back in the negative direction and, at some point, falls below the active region of transistor 10, thus turning transistor 10 "off." Of course, each time the positive swing turns transistor 10 "on," drives it into saturation and turns it "off," a negative output pulse is formed at point 17.

If the potential at point 16, across capacitor 23, remained constant, this process would continue. However, the potential across capacitor 23 is decreasing in the negative direction. Therefore, since the ringing signal is swinging about this potential, the peak voltage of each succeeding positive swing of the signal is becoming smaller. The ringing signal continues, each positive swing producing a pulse at point 17, until the charge on capacitor 23 has decreased negatively enough to pull the peak of the positive swing of the signal down out of the active range of transistor 10. At that time, transistor 10 turns "off" and resistor 31 quickly damps the ringing signal. Thereafter, the circuit remains in the "off" condition while capacitor 23 charges exponentially in the positive direction, as hereinbefore described, until point 16 reaches a potential which will forward bias transistor 10. Thus, the cycle repeats and a second group of pulses is produced at point 17, identical in number and shape to those produced in the first group.

Figure 2:
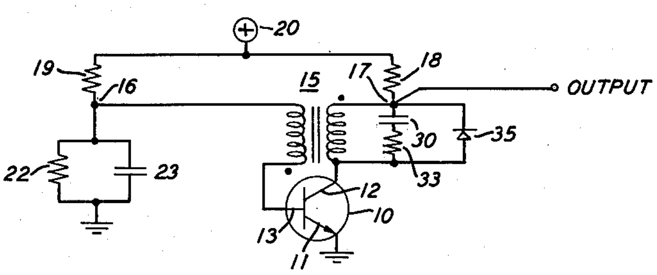
Fig. 2 is an alternative illustrative circuit in accordance with the principles of the invention.

The pulses produced by the circuit of Fig. 1 have very short rise times, but they are not as rectangular in shape as is desired in many applications. A second embodiment of the invention producing groups of pulses more nearly approximating rectangular form is shown in Fig. 2, wherein circuit elements corresponding to those in the circuit of Fig. 1 are labeled with like reference numerals. In Fig. 2, a resistor 33 has been added in series with capacitor 30, and resistor 31 in the circuit of Fig. 1 has been replaced by diode 35. The operation of the circuit of Fig. 2 is substantially the same as the operation of the circuit of Fig. 1. However, resistor 33 placed in series with capacitor 30 damps the voltage change at point 17 when transistor 10 is in the saturated condition. This advantageously results in pulses with very nearly flat tops. The diode 35 connected in parallel with the primary winding of transformer 15 is poled in such a manner as to clip the positive tail that occurs at the end of each pulse.

For a free-running waveform generator of the type shown in Fig. 2, using an NPN transistor and producing groups of three output pulses, the following representative values of the respective circuit elements may be used:

| | | |
|---|---|---|
| Transformer **15** | | Turns ratio of 1:1 |
| Resistor **18** | ohms | 4,700 |
| Resistor **19** | do | 150,000 |
| Battery **20** | volts | +12 |
| Resistor **22** | ohms | 3,300 |
| Capacitor **23** | microfarads | 25 |
| Capacitor **30** | do | 0.01 |
| Resistor **33** | ohms | 360 |

Figure 3A:
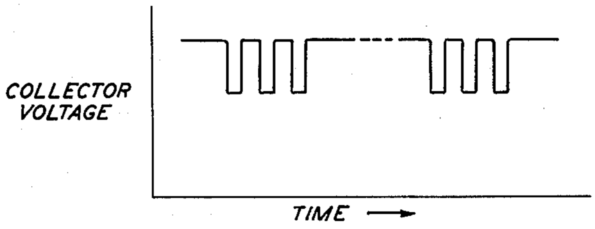
Figs. 3A and 3B are graphical representations of two of the waveforms generated by the circuit of Fig. 2.
Figure 3B:
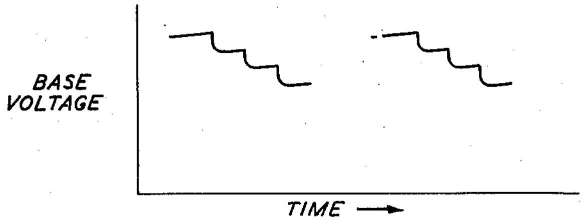

Some of the waveforms appearing in the circuit of Fig. 2 are shown in Figs. 3A and 3B. Two complete cycles are shown in each figure by foreshortening the time period between groups of pulses. The collector voltage waveform occurring at point 17 is shown in Fig. 3A. Assuming the use of the above representative values of the respective circuit elements, each voltage pulse is approximately 12 volts in amplitude and is approximately 180 microseconds in duration. The time between individual pulses is approximately 240 microseconds, and the time between groups of pulses is approximately 6 milliseconds. The number of pulses shown in Fig. 3A is three, lasting a total duration of approximately 1000 microseconds. The base voltage waveform is shown in Fig. 3B and is of the exponential step form.

It is understood, of course, that these pulse widths and time durations indicate only what will be obtained using the particular representative values of the respective circuit elements. By properly choosing the values of these circuit elements, the pulse widths and time durations may be varied by several factors of ten; for example, three output pulses can be generated in a ten microsecond repetition interval.

As was mentioned hereinbefore, the characteristics of the output waveform at point 17 are determined by the various circuit elements. The time interval between pulse groups is largely determined by resistor 19 and capacitor 23. The width of the individual pulses in each group is a function of the inductance of transformer 15 and of the resistance of resistors 18 and 31; and the time period between individual pulses is a function of the inductance of transformer 15 and of the capacitance of capacitor 30. Therefore, the desired waveform is selected by proper variation of particular circuit elements. Consequently, the waveform generation circuit may be advantageously employed as an analogue to digital converter by placing certain of the circuit elements under the analogue control of an exterior circuit.

It is understood that the above-described arrangements are merely illustrative of the application of the principles of the invention. Numerous other arrangements may be devised by those skilled in the art without departing from the spirit and scope of the invention.

What is claimed is:

1. A waveform generator comprising a transistor having an emitter, a base and a collector, means connecting said emitter to ground, a source of potential, a transformer having primary and secondary windings, each of said windings having first and second terminals, a first resistance connected between said source and said first terminal of said primary winding, a second resistance connected between said source and said first terminal of said secondary winding, means connecting said collector and said second terminal of said primary winding, means connecting said base and said second terminal of said secondary winding, a first resistance-capacitance network connected across said primary winding, and a second resistance-capacitance network connected between said first terminal of said secondary winding and ground.

2. A waveform generator in accordance with claim 1 wherein said first resistance-capacitance means includes a capacitor and a resistor connected in parallel across said primary winding of said transformer.

3. A waveform generator in accordance with claim 1 wherein said first resistance-capacitance means includes a capacitor and a resistor connected in series across said primary winding of said transformer.

4. A waveform generator in accordance with claim 3 further including a diode connected across said primary winding of said transformer.

5. A free-running waveform generator comprising a transistor having an emitter, a base and a collector, means for connecting said emitter to ground, means including an inverting transformer having a primary winding and a secondary winding, one terminal of said primary winding connected to said collector and one terminal of said secondary winding connected to said base for coupling the voltage at said collector back to said base, means connected to each of the other terminals of both said primary winding and secondary winding for biasing said transistor, a timing capacitor connected at one plate to said other terminal of said secondary winding and at the other plate to ground, means including said biasing means connected to said one plate of said timing capacitor for controlling the charge time of said timing capacitor, resistance means connected in parallel across said timing capacitor for controlling the discharge time of said timing capacitor, and a resistance-capacitance network connected parallelly across said primary winding.

6. A free-running waveform generator in accordance with claim 5 wherein said resistance-capacitance network comprises a resistor connected in parallel to a capacitor.

7. A free-running waveform generator in accordance with claim 5 wherein said resistance-capacitance network comprises a resistor serially connected to a capacitor.

8. A free-running waveform generator comprising a transistor having emitter and base input electrodes and a collector output electrode, means for connecting one of said input electrodes to reference potential, means including an inverting transformer having a primary winding and a secondary winding, one terminal of said primary winding connected to said output electrode and one terminal of said secondary winding connected to the other input electrode for coupling the voltage at said output electrode back to said other input electrode, means connected to each of the other terminals of both said primary winding and secondary winding for biasing said transistor, a timing capacitor connected at one plate to said other terminal of said secondary winding and at the other plate to said reference potential, means including said biasing means connected to said one plate of said timing capacitor for controlling the charge time of said timing capacitor, means parallelly connected across said timing capacitor for controlling the discharge time of said timing capacitor, and a resistance-capacitance network connected parallelly across said primary winding.

9. A waveform generator in accordance with claim 8 further comprising diode means connected across said transformer primary winding for preventing excessive potential excursions of said collector in a particular polarity direction.

References Cited in the file of this patent

UNITED STATES PATENTS

| | | |
|---|---|---|
| 2,745,012 | Felker | May 8, 1956 |
| 2,854,614 | Light | Sept. 30, 1958 |
| 2,857,518 | Reed | Oct. 21, 1958 |